(12) United States Patent
Lai

(10) Patent No.: US 6,921,951 B2
(45) Date of Patent: Jul. 26, 2005

(54) THIN FILM TRANSISTOR AND PIXEL STRUCTURE THEREOF

(75) Inventor: Han-Chung Lai, Taoyuan Hsien (TW)

(73) Assignee: AU Optronics Corporation, Hsinchu (TW)

( * ) Notice: Subject to any disclaimer, the term of this patent is extended or adjusted under 35 U.S.C. 154(b) by 0 days.

(21) Appl. No.: 10/605,661

(22) Filed: Oct. 16, 2003

(65) Prior Publication Data

US 2005/0029516 A1 Feb. 10, 2005

(30) Foreign Application Priority Data

Aug. 4, 2003 (TW) .......................................... 92121252 A

(51) Int. Cl.⁷ .............................................. H01L 29/40
(52) U.S. Cl. ........................ 257/401; 257/347; 257/387
(58) Field of Search ................................. 257/401, 347, 257/387, 59, 66, 72; 438/284, 286

(56) References Cited

U.S. PATENT DOCUMENTS

| 5,302,987 A | * | 4/1994 | Kanemori et al. ........... 349/143 |
| 5,528,056 A | * | 6/1996 | Shimada et al. .............. 257/72 |
| 5,808,317 A | * | 9/1998 | Kuo ............................. 257/66 |
| 6,310,668 B1 | * | 10/2001 | Ukita ........................... 349/42 |
| 6,320,221 B1 | * | 11/2001 | Choi et al. .................. 257/330 |
| 6,426,517 B2 | * | 7/2002 | Hayakawa et al. ........... 257/72 |
| 6,664,569 B2 | * | 12/2003 | Moon .......................... 257/72 |
| 6,765,270 B2 | * | 7/2004 | Chae .......................... 257/390 |

* cited by examiner

*Primary Examiner*—George Eckert
*Assistant Examiner*—Eugene Lee
(74) *Attorney, Agent, or Firm*—Jianq Chyun IP Office

(57) ABSTRACT

A thin film transistor and a pixel structure with the same are disclosed. The thin film transistor includes a gate electrode with at least one notch, a gate dielectric layer, a source region, a drain region, and a channel layer. The gate electrode is on a substrate. The gate dielectric layer is on the substrate and covers the gate electrode. The source region is on the gate dielectric layer, wherein it is over a region outside the notch of the gate electrode and overlaps a portion of the gate electrode. The drain region is on the gate dielectric layer, wherein it is over the notch of the gate electrode and overlaps the gate electrode at the edge of the notch. Further, the channel layer is on the gate dielectric layer and between the source and drain regions. Due to asymmetric design of the source and drain regions, the parasitic capacitance change can be substantially reduced when a misalignment of the upper and lower metal layers occurs.

13 Claims, 5 Drawing Sheets

THIN FILM TRANSISTOR AND PIXEL STRUCTURE THEREOF

CROSS REFERENCE TO RELATED APPLICATIONS

This application claims the priority benefit of Taiwan application serial no. 92121252, filed on Aug. 4, 2003.

BACKGROUND OF INVENTION

1. Field of the Invention

The present invention relates to a structure of a semiconductor device, and more particularly, to a thin film transistor (TFT) and a pixel structure with the thin film transistor.

2. Description of the Related Art

A thin film transistor liquid crystal display is composed of a thin film transistor array substrate, a color filter array substrate and a liquid crystal layer, wherein the thin film crystal transistor array substrate is composed of many thin film transistors arranged in an array and pixel electrodes corresponding to each thin film transistor to form pixel structures. The thin film transistor mentioned above includes a gate electrode, a channel layer, a source region and a drain region which is adapted to serve as a switch for a liquid crystal display element. However, the typical pixel structure has overlap shift issue as shown in FIGS. 1A and 1B.

FIGS. 1A and 1B are schematic top views of pixel structures without overlap shift and with overlap shift issues in accordance with the prior art respectively. Referring to FIG. 1A, a schematic top view of a pixel structure 100 without overlap shift in accordance with the prior art is shown. The pixel structure 100 comprises a gate electrode 102, a scan line 104, a gate dielectric layer (not shown), a channel layer 106, a source region 108, a drain region 110, a data line 112, a protection layer (not shown) and a pixel electrode 114. The scan line 104 is electrically connected to the gate electrode 102 and formed on a substrate (not shown), wherein the scan line 104 and the gate electrode 102 are formed from a first metal layer. The gate dielectric layer covers the scan line 104 and the gate electrode 102. In addition, the channel layer 106 is formed over the gate dielectric layer formed over the gate electrode 102, and the source region 108 and the drain region 110 are formed on the gate dielectric layer beside the gate electrode 102. The source region 108 and the drain region 110 partially overlap the channel layer 106, wherein the source region 108 and the drain region 110 are formed using a second metal layer. Moreover, the data line 112 is formed over the gate dielectric layer and electrically connected to the source region 108, wherein the data line 112 is also formed using the second metal layer. The gate electrode 102, the channel layer 106 and source region 108 and the drain region 110 respectively constitutes a thin film transistor 120. The protection layer is formed over the thin film transistor 120, the scan line 104 and the data line 112, wherein the protection layer has a contact 116 to expose the drain region 110. The pixel electrode 114 is electrically connected to the drain region 110 through the contact 116.

In the pixel structure mentioned above, a parasitic capacitance $C_{gd(a)}$ within the gate electrode 102 and the drain region 110 depends on the overlap area of the gate electrode 102 and the drain region 110. If the parasitic capacitance within the gate electrode 102 and the drain region 110 changes, the performance of a liquid crystal display will be affected therefrom.

The main cause of changing the parasitic capacitance within the gate electrode and the drain region results from the misalignment of the first metal layer, i.e. the gate electrode, and the second metal layer, i.e. the source/drain regions, as shown in FIG. B. In comparison with FIG. 1A, the second metal including the data line 112, the source/drain regions 108 and 110, respectively, shown in FIG. 2B shifts; therefore, the parasitic capacitance $C_{gd(a)}$ within the gate electrode 102 and the drain region 110 varies with the overlap area of the gate electrode 102 and the drain region 110 as to generate mura effects.

SUMMARY OF INVENTION

Therefore, one object of the present invention is to provide a thin film transistor and a pixel structure having the thin film transistor to substantially reduce the variance of the parasitic capacitance within the gate electrode and the drain region. Even though an overlap shift of the gate electrode and the drain region occurs, the parasitic capacitance does not change.

In accordance with the above object and other advantages, the present invention provides a thin film transistor, comprising a gate electrode having at least one notch, a gate dielectric layer, a source region, a drain region and a channel layer. The gate electrode is formed on a substrate and the gate dielectric layer is formed over the substrate and covers the gate electrode. The source region is formed on the gate dielectric layer, wherein the source region is over a region outside the notch of the gate electrode and the source region overlaps a portion of the gate electrode. The drain region is formed over the gate dielectric layer exposed by the source region, wherein the drain region is over the notch of the gate electrode and the drain region overlaps a portion of the gate electrode at the edge of the notch. Moreover, the channel layer is formed on the gate dielectric layer formed over the gate electrode and between the source region and drain region.

In one embodiment, the source region can overlap the gate electrode or be divided into to two strip regions, wherein each of the two strip regions adjacent to each longitude of the drain region.

The present invention further provides a pixel structure, comprising a scan line, a data line, a gate electrode, a gate dielectric layer, a channel layer, a source region, a protection layer, a contact and a pixel electrode. The scan line is formed on a substrate. The gate electrode is also formed on the substrate and electrically connected to the scan line, wherein the gate electrode has at least one notch. The gate dielectric layer is formed over the substrate and covers the scan line and the gate electrode. The channel layer is formed over the gate dielectric layer formed on the gate electrode. The source region is formed on the channel layer, wherein the source region is over a region outside the notch of the gate electrode and the source region overlaps a portion of the gate electrode. The drain region is formed over the channel layer exposed by the source region, wherein the drain region is over the notch of the gate electrode and the drain region overlaps a portion of the gate electrode at the edge of the notch. The data line is formed on the gate dielectric layer and electrically connected to the source region. The protection layer is formed over the substrate and covers the gate electrode, the gate dielectric layer, the channel layer, the source region, the drain region, the scan line and the data line. The contact is formed within the protection layer and electrically connected to the drain region. In addition, the pixel electrode is formed on the protection layer and electrically connected to the drain region through the contact.

In one embodiment, the source region can overlap the gate electrode or be divided into to two strip regions, wherein each of the two strip regions adjacent to each longitude of the drain region. Moreover, the source region further extends over the gate dielectric layer formed on the scan line.

The present invention further provides a thin film transistor, comprising a scan line, a gate electrode, a gate dielectric layer, a channel layer, a drain region and a trident source region. The scan line is formed on a substrate. The gate electrode is formed on the substrate and electrically connected to the scan line, wherein the gate electrode has at least one notch. The gate dielectric layer is formed over the substrate and covers the scan line and the gate electrode. The drain region is formed over the notch of the gate electrode and overlaps a portion of the gate electrode at the edge of the notch and a portion of scan line. The trident source region is formed on the gate dielectric layer, wherein the trident source region comprises: two first projecting portions formed on the gate dielectric layer, wherein the two first projecting portions are over a region outside the notch of the gate electrode and the two first projecting portions overlap a portion of the gate electrode; a second projecting portion formed over the scan line between the two first projecting portions, wherein the second projecting portion is shorter than the two first projecting portions; and a connection portion, connecting the second projecting portion and the two first projecting portions. In addition, the channel layer formed between the gate electrode and the drain and trident source regions.

In the structure mentioned above, the connection portion of the trident source region extends over the scan line. In addition, the structure further comprises a data line formed on the gate dielectric layer and electrically connected to the trident source region.

Because the present invention uses an asymmetric design for the source region and drain region, when an misalignment of the first metal layer, i.e. the gate electrode, and the second metal layer, i.e. the source region and drain region, occurs, the parasitic capacitance $C_{gd(a)}$ does not change severely. In addition, the structure of the source/drain regions in accordance with the present invention can also be applied to a repair structure.

In order to make the present invention mentioned above, objects, features and advantages thereof or therefrom understandable, a preferred embodiment complying with configurations is described below in detail.

DETAILED DESCRIPTION

Figure 1A:
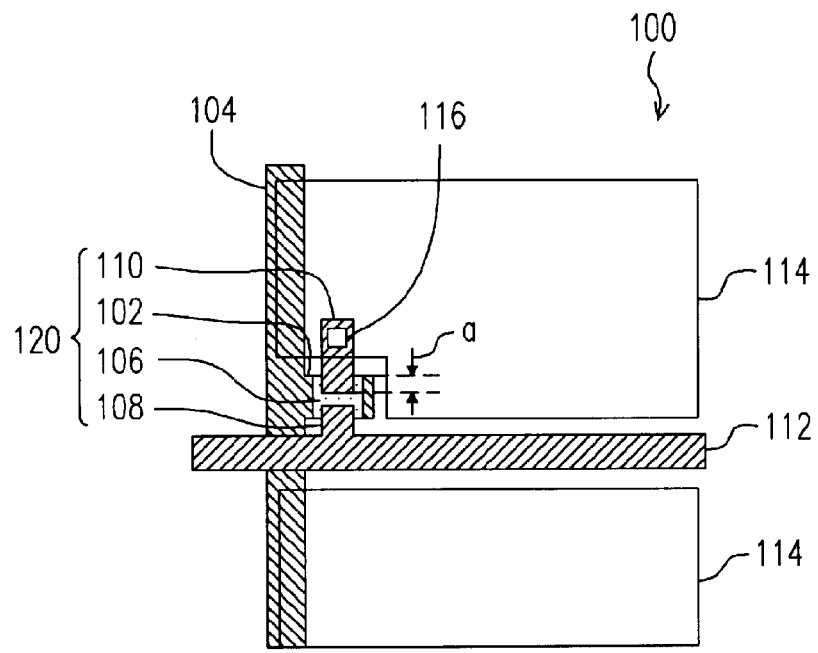
FIGS. 1A and 1B are schematic top views of pixel structures without overlap shift and with overlap shift issues in accordance with the prior art respectively.
Figure 1B:
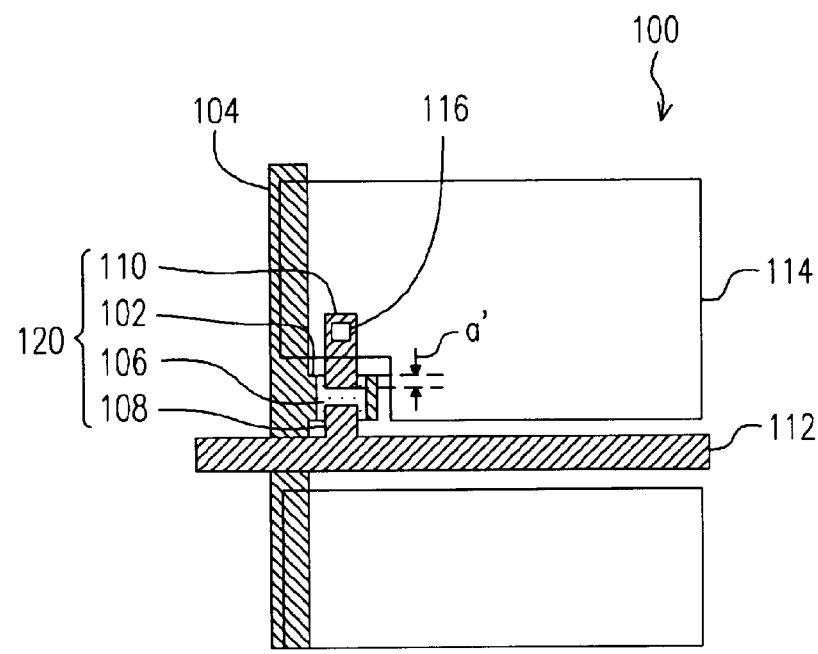
Figure 2:
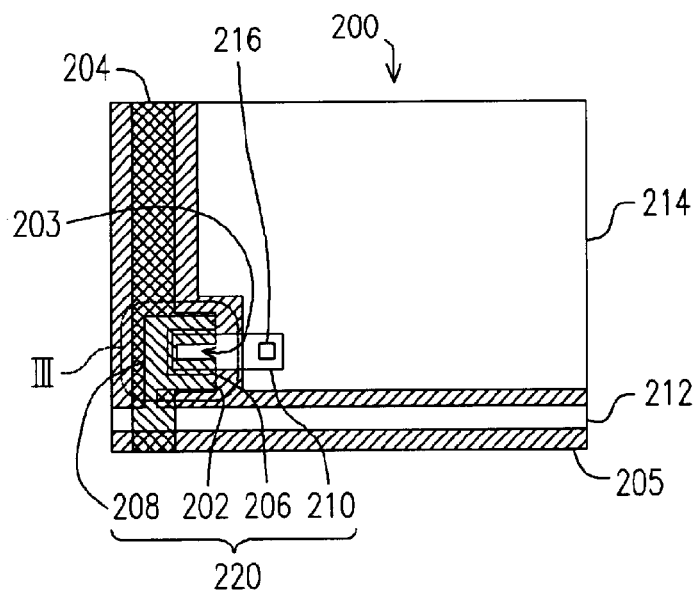
FIG. 2 is a schematic top view of a pixel structure according to a preferred embodiment of the present invention.

FIG. 2 is a schematic top view of a pixel structure according to a preferred embodiment of the present invention. As shown in FIG. 2, the pixel structure 200 comprises a scan line 204, a gate electrode 202, a gate dielectric layer 205, a source region 208, a drain region 210, a channel layer 206, a data line 212, a protection layer (not shown), a contact 216 and a pixel electrode 214. The scan line 204 is formed on a substrate (not shown). The gate electrode 202 is also formed on the substrate and electrically connected to the scan line 204, wherein the gate electrode 202 has at least one notch 203. Moreover, the shape of the notch 203 of the gate electrode 202 can be a triangle, such as an isosceles triangle, a non-isosceles triangle or an equilateral triangle, a quadrilateral, such as a rectangular, a square or a trapezoid, or a non-regular shape and not limited to the shape shown in the figures. The gate dielectric layer 205 is formed over the substrate and covers the scan line 204 and the gate electrode 202. The channel layer 206 is formed over the gate dielectric layer 205 formed on the gate electrode 202. The source region 208 is formed on the channel layer 206, wherein the source region 208 is over a region outside the notch 203 of the gate electrode 202 and the source region 208 overlaps a portion of the gate electrode 202. The drain region 210 is formed over the channel layer 206 exposed by the source region 208, wherein the drain region 210 is over the notch 203 of the gate electrode 202 and the drain region 208 overlaps a portion of the gate electrode 202 at the edge of the notch 203. Moreover, the channel layer 206, the source region 208, the drain region 210 and the gate electrode 202 constitute a thin film transistor 220. Moreover, an etch stop layer, such as I stopper, is formed between the channel layer 206 and the source and drain regions 208 and 210 respectively. The data line 212 is formed on the gate dielectric layer 205 and electrically connected to the source region 208. The protection layer is formed over the thin film transistor 220, the scan line 204 and the data line 212. The contact 216 is formed within the protection layer and electrically connected to the drain region 210. In addition, the pixel electrode 214 is formed on the protection layer and electrically connected to the drain region 210 through the contact 216. In order to describe the advantages of the present invention in detail, please refer to FIGS. 3A and 3B.

Figure 3A:
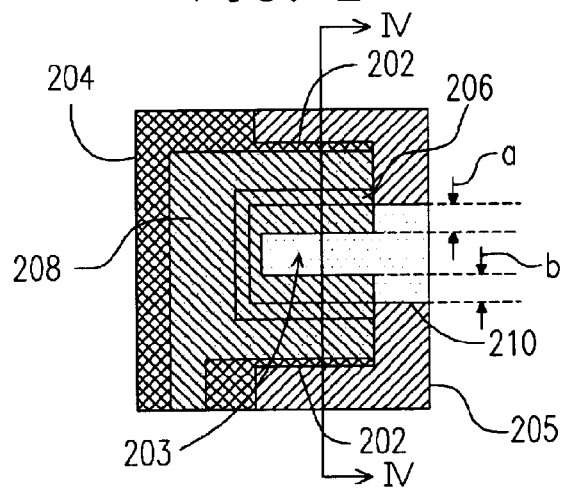
FIGS. 3A and 3B are enlarged schematic top views of the III region of the thin film transistor of FIG. 2 without overlap shift and with overlap shift issues respectively.
Figure 3B:
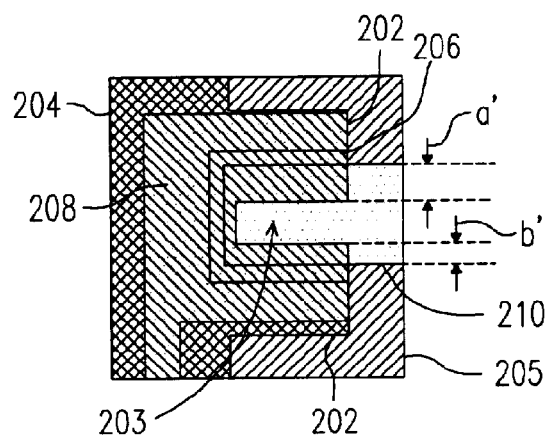

FIGS. 3A and 3B are enlarged schematic top views of the III region of the thin film transistor of FIG. 2 without overlap shift and with overlap shift issues respectively. As shown in FIGS. 3A and 3B, in the thin film transistor 220 of the present invention the parasitic capacitance $C_{gd(a+b)}$ in which the gate electrode 202 and the drain region 210 do not have overlap shift shown in FIG. 3A, and the parasitic capacitance $C_{gd(a"+b")}$ in which the gate electrode 202 and the drain region 210 have overlap shift shown in FIG. 3B depends on the overlap area of the gate electrode 202 and the drain region 210. The design of the present invention can substantially reduce the variance of parasitic capacitance; moreover, even if an overlap shift of the gate electrode and the drain region occurs, the parasitic capacitance of the gate electrode 202 and the drain region 210 does not change, wherein the channel layer 206 is represented by a dot region over the gate electrode 202.

In addition, in some embodiments, the notch 203 of the gate electrode 202 can be extended as to current variance resulting from the overlap variance in horizontal direction.

Figure 4A:
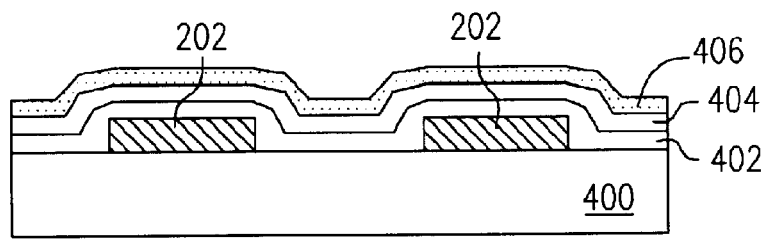
FIGS. 4A to 4F are schematic cross-sectional configurations along IV—IV of FIG. 3 showing progression steps of a fabrication process of a thin film transistor in accordance with the present invention.

FIGS. 4A to 4F are schematic cross-sectional configurations taken along IV—IV of FIG. 3, showing the progression process steps of a fabrication process of a thin film transistor in accordance with the present invention. As shown in FIG. 4A, in the thin film transistor of the embodiment a first metal layer for forming the scan line 204 as shown in FIG. 3A and the gate electrode 202 is formed on a substrate 400. A gate dielectric 402 is then formed over the substrate 400 and covers the scan line and the gate electrode 202. An amorphous silicon (α-Si) layer 404 and an etch stop layer 406 are sequentially formed thereon, wherein the material of the etch stop layer 406 is, for example, silicon nitride.

Figure 4B:
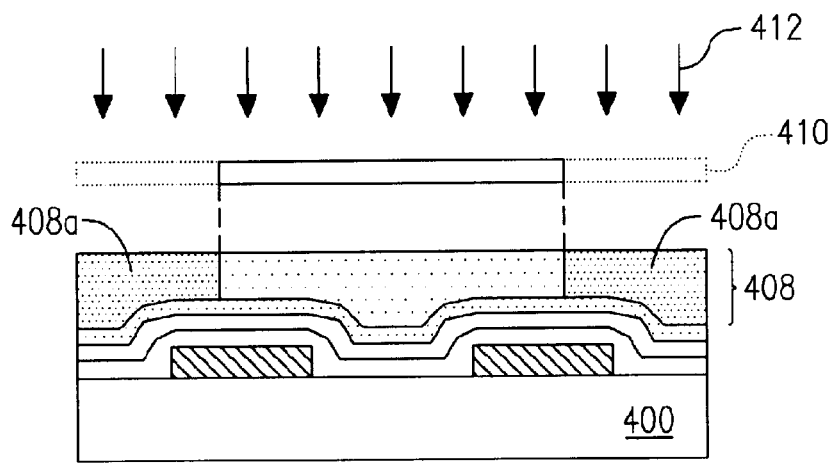

Then, Referring to FIG. 4B, a photoresist layer 408 is formed over the substrate 400. A photomask 410 located over the gate electrode 202 is utilized to perform an exposure process 412 for the photoresist layer 408. A region 408c which is exposed during the exposure process is defined as a region that the channel layer 206 as shown in FIG. 3A is going to be formed therein.

Figure 4C:
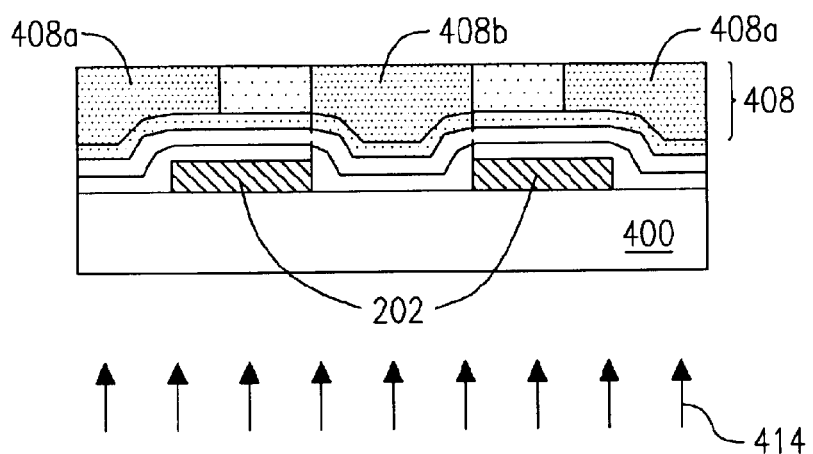

Referring to FIG. 4C, another exposure process 414 is then performed on the photoresist layer 408 from the backside of the substrate 400 in which the exposed region 408b uses the first metal layer, i.e. the gate electrode 202, as a photomask.

Figure 4D:
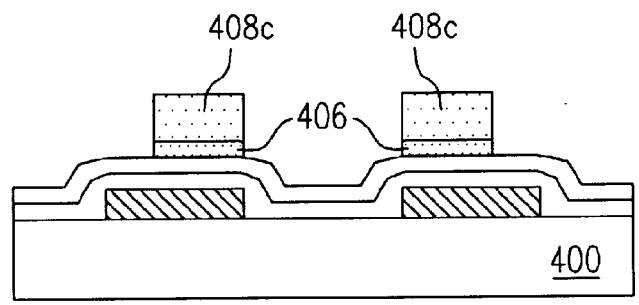

Referring to FIG. 4D, the exposed photoresist layer 408 is developed and the remaining photoresist layer 408c serves as an etch mask for patterning the etch stop layer 406.

Figure 4E:
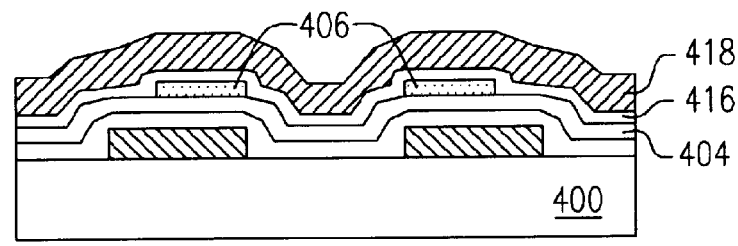

Referring to FIG. 4E, the remaining photoresist layer is removed and an ohmic-contact layer 416 is formed over the substrate 400 and covers the amorphous silicon layer 404 and the etch stop layer 406. Then, a second metal layer 418 is formed on the ohmic-contact layer 416.

Figure 4F:
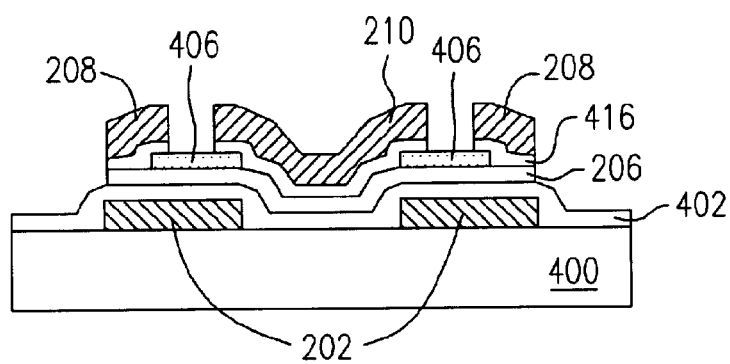

Referring to FIG. 4F, the source region 208 and drain region 210 are formed by patterning the second metal layer 418. From the photomask used for patterning the second metal layer 418, portions of the ohmic-contact layer 416 and the amorphous silicon layer 404 are removed. Because the etch stop layer 406 is formed on a portion of the gate electrode 202, the amorphous silicon layer 404 beneath the etch stop layer 406 is not removed and forms the channel layer 206.

Figure 5:
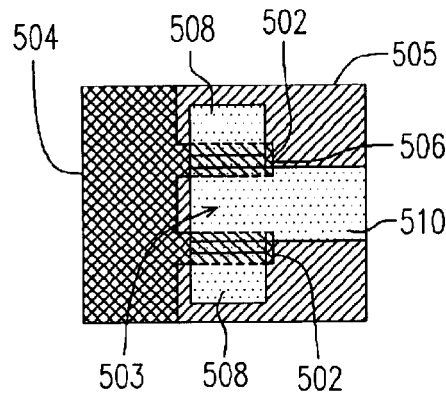
FIG. 5 and FIG. 6 are schematic top views of exemplary embodiments in accordance with the present invention.
Figure 6:
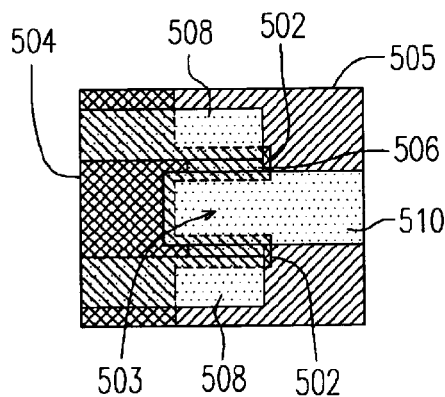

In addition, the structure of the thin film transistor of the present invention includes some variations as shown in FIG. 5 and FIG. 6.

FIG. 5 and FIG. 6 are schematic top views of exemplary embodiments in accordance with the present invention. Referring to FIG. 5 and FIG. 6, the structure of the scan line 504 and gate electrode 502 are the same as shown in FIG. 4A. The channel layers 506, i.e. the dot region, as shown in FIG. 5 and FIG. 6 are both formed over the gate dielectric layer 505 formed on the gate electrode 502; the difference therein is the structures of the source region 508 and the drain region 510. As shown in FIG. 5, the drain region 510 overlaps a portion of the gate electrode 502 at the edge of the notch 503, and the source region 508 includes two strip regions in which each of the two strip regions is adjacent to each longitude of the drain region 510. As shown in FIG. 6, the drain region 510 overlaps a portion of the gate electrode 502 at the edge of the notch 503 and a portion of scan line 504, and the source region 508 includes two strip regions in which each of the two strip regions is adjacent to each longitude of the drain region 510 and extends over the scan line 504.

Figure 7:
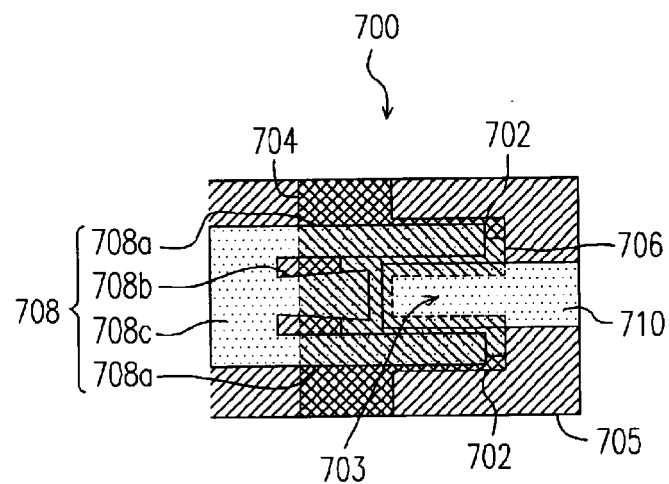
FIG. 7 is a schematic top view of a thin film transistor according to a preferred embodiment of the present invention.

In addition, referring to FIG. 7, the structure of the present invention can also be applied to a repair structure.

FIG. 7 is a schematic top view of a thin film transistor of a preferred embodiment according to the present invention. Referring to FIG. 7, a thin film transistor 700 of the present invention comprises a scan line 704, a gate electrode 702, a gate dielectric layer 705, a channel layer 706, a drain region 710 and a trident source region 708. The structure of FIG. 7 is similar to that of FIG. 4C, wherein the channel layer 706, i.e. the dot region, is on the gate dielectric layer 705 formed on the gate electrode 702. The difference between FIG. 7 and FIG. 4C is that the trident source region 708 of FIG. 7 is formed on the gate dielectric layer 705, wherein the trident source region comprises: two first projecting portions 708a formed on the gate dielectric layer 705; a second projecting portion 708b formed over the scan line 704 between the two first projecting portions 708a; and a connection portion 708c connecting the second projecting portion 708b and the two first projecting portions 708a. The two first projecting portions 708a are over a region outside the notch 703 of the gate electrode 702 and the two first projecting portions 708a overlap a portion of the gate electrode 702. Moreover, the second projecting portion 708b is shorter than the two first projecting portions and the connection portion 708c can be over the scan line 704. Therefore, when one projecting portion 708a or 708b of the trident source region 708 does not work, the connection between the connection portion 708c and the failed projecting portion can be disconnected for repairing.

As the described above, a feature of the present invention includes forming an asymmetric structure of the drain region and the source region so that when a misalignment between the first metal layer, i.e. the gate electrode, and the second metal layer, i.e. the drain region and the source region, occurs, the variance of parasitic capacitance $C_{gd}$ can be substantially reduced. In addition, the source/drain structures of the present invention can also be applied in a repair structure; therefore, the device yield can be improved.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention. Therefore, the scope of the present invention should be interpreted by the claims described below.

What is claimed is:

1. A thin film transistor, comprising:

a gate electrode, formed on a substrate, wherein the gate electrode has at least one notch;

a gate dielectric layer, formed over the substrate, covering the gate electrode;

a source region, formed on the gate dielectric layer, wherein the source region is located over a region outside the notch of the gate electrode and the source region overlaps a portion of the gate electrode;

a drain region, formed over the gate dielectric layer exposed by the source region, wherein the drain region is over the notch of the gate electrode and the drain region overlaps a portion of the gate electrode at the edge of the notch; and a channel layer formed on the gate dielectric layer and located over the gate electrode and between the source region and drain region.

2. The thin film transistor of claim 1, further comprising an etch stop layer formed between the channel layer and the source and drain regions.

3. The thin film transistor of claim 1, further comprising an ohmic-contact layer formed between the channel layer and the source and drain regions.

4. The thin film transistor of claim 1, wherein the source region overlaps the gate electrode.

5. The thin film transistor of claim 1, wherein the source region comprises two strip regions, each of the two strip regions adjacent to each longitude of the drain region.

6. The thin film transistor of claim 1, wherein the shape of the notch of the gate electrode is a triangle, a quadrilateral or a non-regular shape.

7. A pixel structure, comprising:

a scan line, formed on a substrate;

a gate electrode, formed on the substrate and electrically connected to the scan line, wherein the gate electrode has at least one notch;

a gate dielectric layer, formed over the substrate, covering the scan line and the gate electrode;

a channel layer, formed over the gate dielectric layer and located over the gate electrode;

a source region, formed on the channel layer, wherein the source region is over a region outside the notch of the gate electrode and the source region overlaps a portion of the gate electrode;

a drain region, formed over the channel layer exposed by the source region, wherein the drain region is over the notch of the gate electrode and the drain region overlaps a portion of the gate electrode at the edge of the notch;

a data line, formed on the gate dielectric layer, wherein the data line is electrically connected to the source region;

a protection layer, formed over the substrate, covering the gate electrode, the gate dielectric layer, the channel layer, the source region, the drain region, the scan line and the data line;

a contact, formed within the protection layer and electrically connected to the drain region; and a pixel electrode, formed on the protection layer, the pixel electrode electrically connected to the drain region through the contact.

8. The pixel structure of claim 7, further comprising an etch stop layer formed between the channel layer and the source and drain regions.

9. The pixel structure of claim 7, further comprising an ohmic-contact layer formed between the channel layer and the source and drain regions.

10. The pixel structure of claim 7, wherein the source region overlaps the gate electrode.

11. The pixel structure of claim 7, wherein the source region comprises two strip regions, each of the two strip regions adjacent to each longitude of the drain region.

12. The pixel structure of claim 11, wherein the source region further extends over the gate dielectric layer formed on the scan line.

13. The pixel structure of claim 7, wherein the shape of the notch of the gate electrode is a triangle, a quadrilateral or a non-regular shape.

* * * * *